(12) United States Patent
Koehler et al.

(10) Patent No.: US 9,490,356 B2
(45) Date of Patent: Nov. 8, 2016

(54) GROWTH OF HIGH-PERFORMANCE III-NITRIDE TRANSISTOR PASSIVATION LAYER FOR GAN ELECTRONICS

(71) Applicant: The United States of America, as represented by the Secretary of the Navy, Washington, DC (US)

(72) Inventors: Andrew D. Koehler, Alexandria, VA (US); Travis J. Anderson, Alexandria, VA (US); Karl D. Hobart, Alexandria, VA (US); Francis J. Kub, Arnold, MD (US)

(73) Assignee: The United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 15/080,620

(22) Filed: Mar. 25, 2016

(65) Prior Publication Data

US 2016/0204222 A1    Jul. 14, 2016

Related U.S. Application Data

(62) Division of application No. 14/272,539, filed on May 8, 2014.

(60) Provisional application No. 61/822,715, filed on May 13, 2013.

(51) Int. Cl.
*H01L 29/778*  (2006.01)
*H01L 21/02*  (2006.01)
*H01L 21/306*  (2006.01)
(Continued)

(52) U.S. Cl.
CPC ..... *H01L 29/7787* (2013.01); *H01L 21/02458* (2013.01); *H01L 21/02661* (2013.01); *H01L 21/30604* (2013.01); *H01L 29/66462* (2013.01);CPC ........ *H01L 21/0254* (2013.01); *H01L 21/0262* (2013.01); *H01L 29/2003* (2013.01)

(58) Field of Classification Search
CPC ..................... H01L 29/7787; H01L 29/66462
See application file for complete search history.

(56) References Cited

U.S. PATENT DOCUMENTS 6,812,156 B2    11/2004 Day et al.
7,045,404 B2    5/2006  Sheppard et al.
(Continued)

OTHER PUBLICATIONS

S. Huang, Q. Jiang, S. Yang, C. Zhou, and K. J. Chen, "Effective Passivation of AlGaN/GaN HEMTs by ALD-Grown AlN Thin Film," IEEE Electron Device Letters, vol. 33, No. 4, pp. 516-518 (2012).

(Continued)

*Primary Examiner* — Mohammad Islam
*Assistant Examiner* — Christina Sylvia
(74) *Attorney, Agent, or Firm* — US Naval Research Laboratory; Joslyn Barritt

(57) ABSTRACT

Methods for forming a high-quality III-nitride passivation layer on an AlGaN/GaN HEMT. A III-nitride passivation layer is formed on the surface of an AlGaN/GaN HEMT by means of atomic layer epitaxy (ALE), either before or after deposition of a gate metal electrode on the AlGaN barrier layer. Depending on the gate metal and/or the passivation material used, the III-nitride passivation layer can be formed by ALE at temperatures between about 300° C. and about 85020 C. In a specific embodiment, the III-nitride passivation layer can be an AlN layer formed by ALE at about 550° C. after deposition of a Schottky metal gate electrode. The III-nitride passivation layer can be grown so as to conformally cover the entire device, providing a hermetic seal that protects the against environmental conditions.

17 Claims, 5 Drawing Sheets

(51) Int. Cl.
*H01L 29/66* (2006.01)
*H01L 29/20* (2006.01)

(56) References Cited

U.S. PATENT DOCUMENTS

| | | | |
|---|---|---|---|
| 8,268,648 B2 | 9/2012 | Pan | |
| 2003/0020092 A1* | 1/2003 | Parikh | H01L 29/518 257/192 |
| 2008/0210949 A1 | 9/2008 | Makabe et al. | |
| 2010/0327322 A1 | 12/2010 | Kub et al. | |
| 2012/0141799 A1* | 6/2012 | Kub | B82Y 30/00 428/408 |
| 2013/0017323 A1* | 1/2013 | Garces | C23C 16/02 427/126.4 |

OTHER PUBLICATIONS

S. Huang, Q. Jiang, S. Yang, Z. Tang, and K. J. Chen, "Mechanism of PEALD-Grown AlN Passivation for AlGaN/GaN HEMTs: Compensation of Interface Traps by Polarization Charges," IEEE Electron Device Letters, vol. 34, No. 2, pp. 193-195 (2013).

S.C. Binari, K. Ikossi, J.A. Roussos, W. Kruppa, D. Park, H.B. Dietrich, D.D. Koleske, A.E. Wickenden, and R.L. Henry, "Trapping Effects and Microwave Power Performance," IEEE Transactions on Electron Devices, vol. 48, No. 3, pp. 465-471 (2001).

D. Jin and J. del Alamo, "Mechanisms responsible for dynamic ON-resistance in GaN high-voltage HEMTs," Proc. of 2012 24th Int'l Symp. on Power Semiconductor Devices and ICs, pp. 333-336.

H. Chen, P. Preecha, J. Lai, and G.P. Li, "Charge Trapping at Surface in GaN HEMTs," CS Mantech, 2008, pp. 6-9.

B. Green, K. Chu, E.M. Chumbes, J.A. Smart, J.R. Shealy, and L.F. Eastman, "The Effect of Surface Passivation on the Microwave Characteristics of Undoped AlGaN/GaN HEMT's," IEEE Electron Device Letters, vol. 21, No. 6, pp. 268-270 (2000).

D.S. Lee, O. Laboutin, Y. Cao, W. Johnson, E. Beam, A. Ketterson, M. Schuette, P. Saunier, and T. Palacios, "Impact of Al2O3 Passivation Thickness in Highly Scaled GaN HEMTs," IEEE Electron Device Letters, vol. 33, No. 7, (Jul. 2012).

J.J. Freedsman, T. Kubo, and T. Egawa, "Effect of AlN growth temperature on trap densities of in-situ metal-organic chemical vapor deposition grown AlN/AlGaN/GaN metal-insulator-semiconductor heterostructure field-effect transistors," AIP Advances 2, 022134 (2012).

M.A.L. Johnson, S. Fujita, W.H. Rowland, Jr., K.A. Bowers, W.C. Hughes, Y.W. He, N.A. El-Masry, J.W. Cook, Jr., J.F. Schetzina, J. Ren and J.A. Edmond, "Molecular beam epitaxy growth and properties of GaN, AlxGa1-xN, and AlN on GaN/SiC substrates," J. Vac. Sci. Technol. B 14(3) (May/Jun. 1996).

* cited by examiner

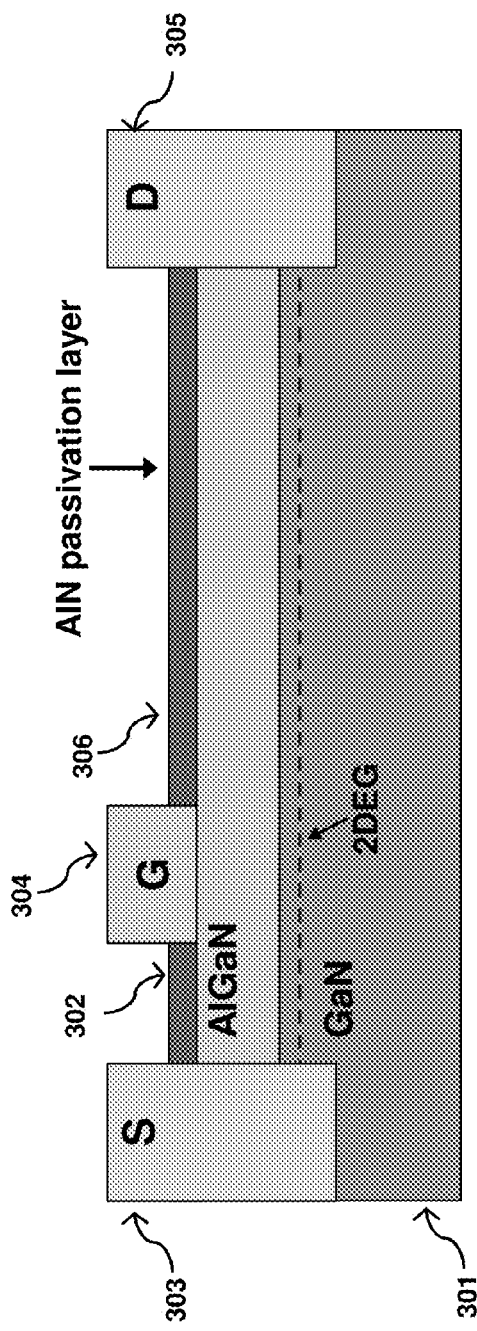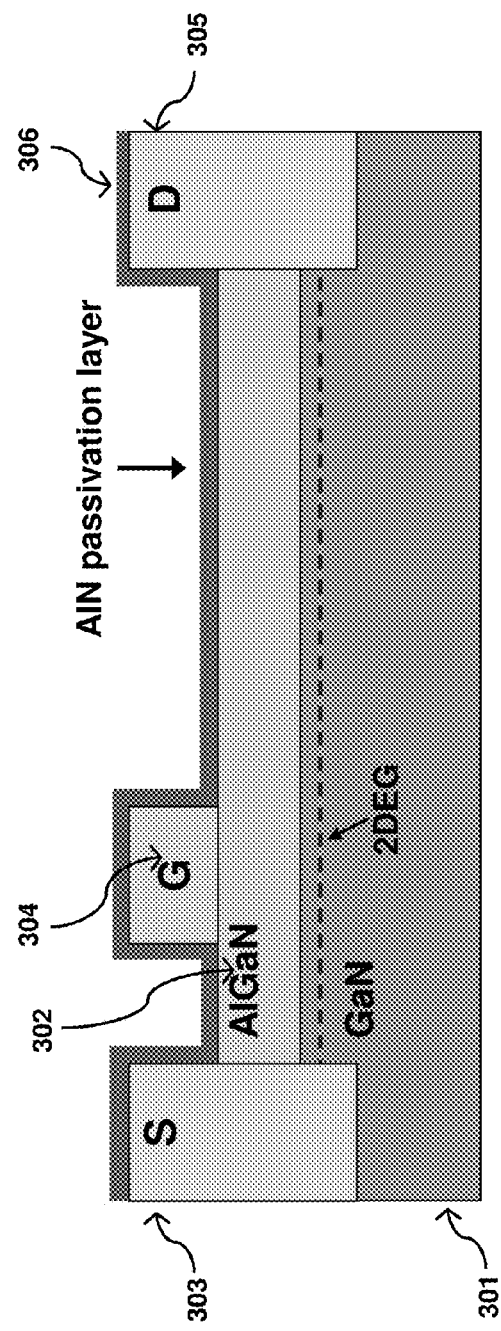

GROWTH OF HIGH-PERFORMANCE III-NITRIDE TRANSISTOR PASSIVATION LAYER FOR GAN ELECTRONICS

CROSS-REFERENCE

This application is a divisional of, and claims the benefit of priority under 35 U.S.C. §120 based on, U.S. patent application Ser. No. 14/272,539 filed on May 8, 2014, which is a Nonprovisional of, and claims the benefit of priority under 35 U.S.C. §119 based on, U.S. Provisional Patent Application No. 61/822,715 filed on May 13, 2013, both of which are hereby incorporated by reference into the present application in their entirety.

TECHNICAL FIELD

The present invention relates to passivation of high electron mobility transistors (HEMTs), specifically to growth of ultrathin III-Nitride passivation layers on AlGaN/GaN HEMTs.

BACKGROUND

AlGaN/GaN high electron mobility transistors (HEMTs) are attractive for high power, high frequency and high power switching applications. However, limitations in performance arise from charge trapping effects, particularly in the access region between the gate and drain. FIG. 1 is a block diagram illustrating an exemplary conventional AlGaN/GaN HEMT. Such an exemplary AlGaN/GaN HEMT includes a GaN channel/buffer layer 101 and an AlGaN barrier layer 102, with a source 103, gate 103, and a drain 104 formed on the AlGaN layer.

During operation of such a conventional AlGaN/GaN HEMTs, surface states trap surface electrons between the gate and the drain. Such trapped electrons deplete the two-dimensional electron gas (2DEG) in the GaN channel layer between the gate and the drain, by causing, e.g., current collapse, gate lag, drain lag, reduction in the maximum drain current ($I_{DS,MAX}$), increase in the dynamic on resistance ($R_{ON,DYN}$), and breakdown. See S. C. Binari, K. Ikossi, J. A. Roussos, W. Kruppa, D. Park, H. B. Dietrich, D. D. Koleske, A. E. Wickenden, and R. L. Henry, "Trapping Effects and Microwave Power Performance," *IEEE Transactions on Electron Devices*, Vol. 48, No. 3, pp. 465-471 (2001); D. Jin and J. del Alamo, "Mechanisms responsible for dynamic ON-resistance in GaN high-voltage HEMTs," *Proc. of 2012 24th Int'l Symp. on Power Semiconductor Devices and ICs*, pp. 333-336; H. Chen, P. Preecha, J. Lai, and G. P. Li, "Charge Trapping at Surface in GaN HEMTs," CS MANTECH, 2008, pp. 6-9. Such effects reduce the flow of charge and limit the performance and reliability of the device.

Surface passivation mitigates charge trapping at the surface and thus improves performance.

$SiN_x$ grown by means of plasma-enhanced chemical vapor deposition (PECVD) has been used to passivate AlGaN/GaN HEMT surface states. See B. Green, K. Chu, E. M. Chumbes, J. A. Smart, J. R. Shealy, and L. F. Eastman, "The Effect of Surface Passivation on the Microwave Characteristics of Undoped AlGaN/GaN HEMT's," *IEEE Electron Device Letters*, Vol. 21, No. 6, pp. 268-270 (2000). However, use of $SiN_x$ to passivate AlGaN/GaN HEMTs requires the use of thick passivation layers, which limits the RF (radio frequency) performance of the device. See D. S. Lee, O. Laboutin, Y. Cao, W. Johnson, E. Beam, A. Ketterson, M. Schuette, P. Saunier, and T. Palacios, "Impact of Al2O3 Passivation Thickness in Highly Scaled GaN HEMTs," *IEEE Electron Device Letters*, Vol. 33, No. 7, (July 2012).

III-nitride materials such as AlN on AlGaN offer high quality passivation by providing a high dielectric constant, large bandgap, high thermal conductivity, small lattice mismatch to AlGaN/GaN, positive fixed charge from polarization, high breakdown field, and low interface trap density.

The use of AlN as a passivation layer has other benefits as well. The AlN layer on the AlGaN/GaN HEMT introduces strain into the device; this additional strain can enhance the barrier piezoelectric polarization and therefore enhances the 2DEG sheet carrier density. In addition, in the case of radio frequency (RF) performance, an ultrathin passivation layer on the surface is favorable for reduced parasitic capacitances.

In addition, high power operation of HEMT devices requires large currents and large voltages, creating self-heating which can further hamper device performance and reliability. III-nitride materials have a high thermal conductivity (e.g., >180 W $m^{-1}$° $C.^{-1}$ in the case of AlN), and so by placing a layer of a III-nitride or other high thermal conductivity material in close proximity to the source of heat generation, which is in the channel at the gate edges, can act as a highly efficient heat sink, removing the heat from the source.

AlN is usually grown by metal organic chemical vapor deposition (MOCVD) and molecular beam epitaxy (MBE) at temperatures of about 600° C. or higher. See J. J. Freedsman, T. Kubo, and T. Egawa, "Effect of AlN growth temperature on trap densities of in-situ metal-organic chemical vapor deposition grown AlN/AlGaN/GaN metal-insulator-semiconductor heterostructure field-effect transistors," *AIP Advances* 2, 022134 (2012); and M. A. L. Johnson, S. Fujita, W. H. Rowland, Jr., K. A. Bowers, W. C. Hughes, Y. W. He, N. A. El-Masry, J. W. Cook, Jr., J. F. Schetzina, J. Ren and J. A. Edmond, "Molecular beam epitaxy growth and properties of GaN, AlxGal-xN, and AlN on GaN/SiC substrates," *J. Vac. Sci. Technol. B* 14(3) (May/June 1996).

When used as a passivation layer, AlN has conventionally been grown by atomic layer deposition (ALD) at temperatures of about 300° C. While such ALD-grown passivation layers have been shown to reduce charge-trapping effects better than $SiN_x$, the low crystallinity of the ALD AlN films limits their passivation performance. See S. Huang, Q. Jiang, S. Yang, C. Zhou, and K. J. Chen, "Effective Passivation of AlGaN/GaN HEMTs by ALD-Grown AlN Thin Film," *IEEE Electron Device Letters*, Vol. 33, No. 4, pp. 516-518 (2012); and S. Huang, Q. Jiang, S. Yang, Z. Tang, and K. J. Chen, "Mechanism of PEALD-Grown AlN Passivation for AlGaN/GaN HEMTs: Compensation of Interface Traps by Polarization Charges," *IEEE Electron Device Letters*, Vol. 34, No. 2, pp. 193-195 (2013).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for growing a high-quality III-nitride passivation layer on an AlGaN/GaN HEMT.

In accordance with the present invention, a III-nitride passivation layer is formed on an AlGaN/GaN HEMT where the passivation layer is grown by means of atomic layer epitaxy (ALE) carried out at a temperature between 300° C. and 850° C., depending on the passivation material and the gate metal used. The presence of a passivation layer reduces the presence of trapped charges at the surface and improves the carrier density of the two-dimensional electron gas (2DEG). Growth of the passivation layer by ALE in accordance with the present invention provides a passivation layer with a high degree of crystallinity and fewer defects, which reduces the likelihood of trapped charges at the device surface.

In some embodiments, the passivation layer is grown after formation of the gate electrode in the device, while in other embodiments, the passivation layer is grown after the deposition and annealing of the ohmic source and drain electrodes, but before the formation of the gate.

In other embodiments, the passivation layer is grown before formation of the source, gate, and drain electrodes. In some such embodiments, contact windows exposing the AlGaN surface for the source, gate, and drain are etched in the passivation layer, while in other such embodiments, contact windows are etched only for the source and drain, leaving the passivation layer intact under the gate to serve as a gate dielectric.

In still other embodiments, the passivation layer can be grown on the surface of the AlGaN barrier layer after formation of all of the source, gate, and drain electrodes, and in some such embodiments the passivation layer can be conformally grown over the entire surface to provide a hermetic seal around the device.

In many embodiments in accordance with the method of the present invention, the passivation layer is in the form of an AlN passivation layer. In some embodiments, the AlN passivation layer can be grown by ALE before formation of the gate, with growth at temperatures between 300° C. and 850° C. In other embodiments, the AlN passivation layer can be grown after deposition of a Schottky metal gate electrode on the AlGaN barrier layer, where the AlN passivation layer is formed by ALE at a temperature of about 550° C.

A III-nitride layer formed in accordance with the present invention provides highly effective passivation that prevents the trapping of electrons at surface states and the resulting depletion of the two-dimensional electron gas (2DEG) in the GaN channel layer, allowing current to flow freely through the device, thereby improving its performance.

BRIEF DESCRIPTION OF THE DRAWINGS

FIGS. 3A and 3B are block diagrams illustrating embodiments of a passivated AlGaN/GaN HEMT that includes a III-nitride passivation layer formed by ALE in accordance with the present invention.

DETAILED DESCRIPTION

Figure 1:
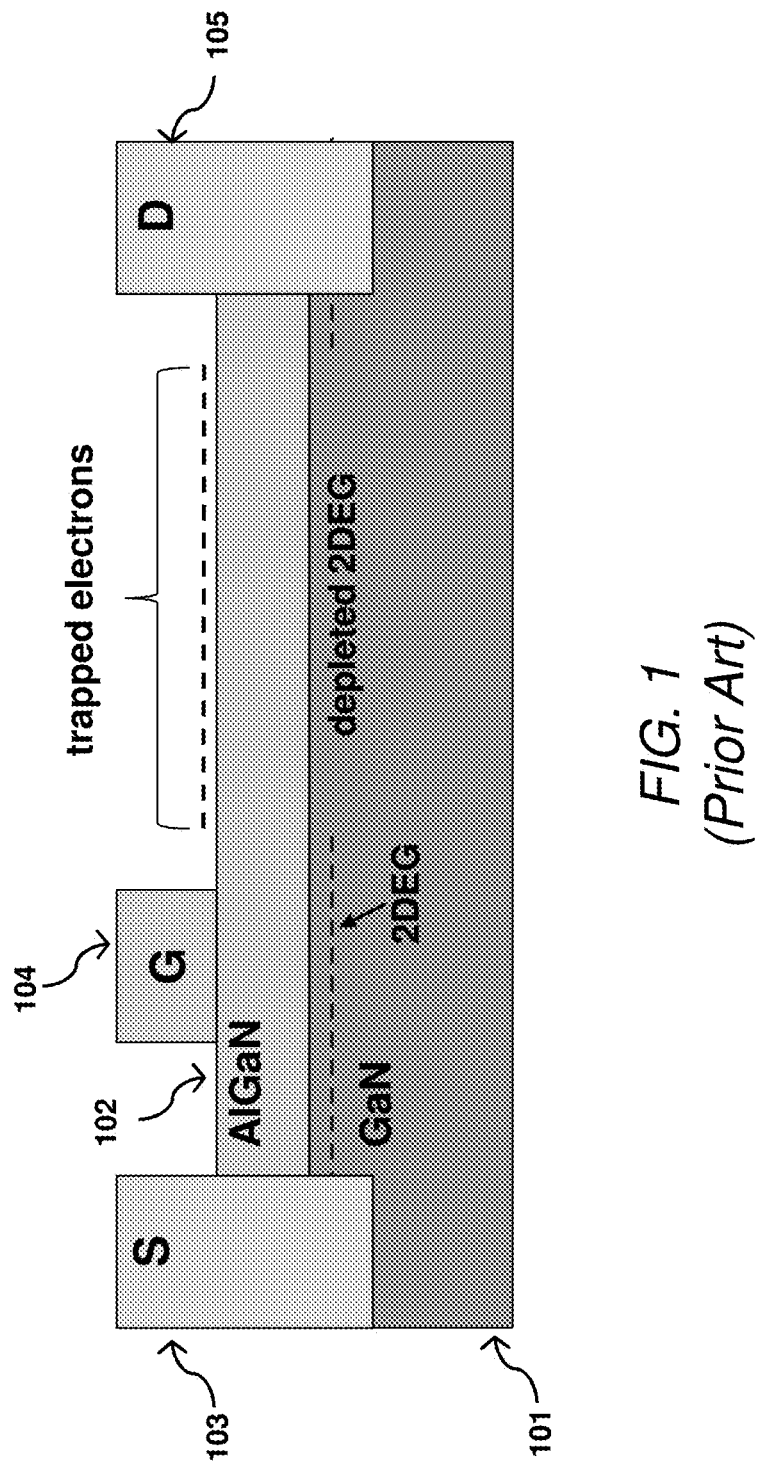
FIG. 1 is a block diagram illustrating an unpassivated AlGaN/GaN HEMT in accordance with the prior art.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

As noted above, III-nitride passivation of the surface of an AlGaN/GaN HEMT can reduce 2DEG depletion and improve performance of the device.

The present invention provides methods for growing a high-quality III-nitride passivation layer on an AlGaN/GaN HEMT.

In accordance with the present invention, a III-nitride passivation layer is formed on an AlGaN/GaN HEMT where the passivation layer is grown by means of atomic layer epitaxy (ALE) carried out at a temperature between 300° C. and 850° C., depending on the passivation material and the gate metal used. The presence of a passivation layer reduces the presence of trapped charges at the surface and improves the carrier density of the two-dimensional electron gas (2DEG). Growth of the passivation layer by ALE in accordance with the present invention provides a passivation layer with a high degree of crystallinity and fewer defects, which reduces the likelihood of trapped charges at the device surface.

In some embodiments, the passivation layer is grown after formation of the gate electrode in the device, while in other embodiments, the passivation layer is grown after the deposition and annealing of the ohmic source and drain electrodes, but before the formation of the gate.

In other embodiments, the passivation layer is grown before formation of the source, gate, and drain electrodes. In some such embodiments, contact windows exposing the AlGaN surface for the source, gate, and drain are etched in the passivation layer, while in other such embodiments, contact windows are etched only for the source and drain, leaving the passivation layer intact under the gate to serve as a gate dielectric.

In still other embodiments, the passivation layer can be grown on the surface of the AlGaN barrier layer after formation of all of the source, gate, and drain electrodes, and in some such embodiments the passivation layer can be conformally grown over the entire surface to provide a hermetic seal around the device.

In many embodiments in accordance with the method of the present invention, the passivation layer is in the form of an AlN passivation layer. In some embodiments, the AlN passivation layer can be grown by ALE before formation of the gate, with growth at temperatures between 300° C. and 850° C. In other embodiments, the AlN passivation layer can be grown after deposition of a Schottky metal gate electrode on the AlGaN barrier layer, where the AlN passivation layer is formed by ALE at a temperature of about 550° C.

A III-nitride layer formed in accordance with the present invention provides highly effective passivation that prevents the trapping of electrons at surface states and the resulting depletion of the two-dimensional electron gas (2DEG) in the GaN channel layer, allowing current to flow freely through the device, thereby improving its performance.

Figure 2:
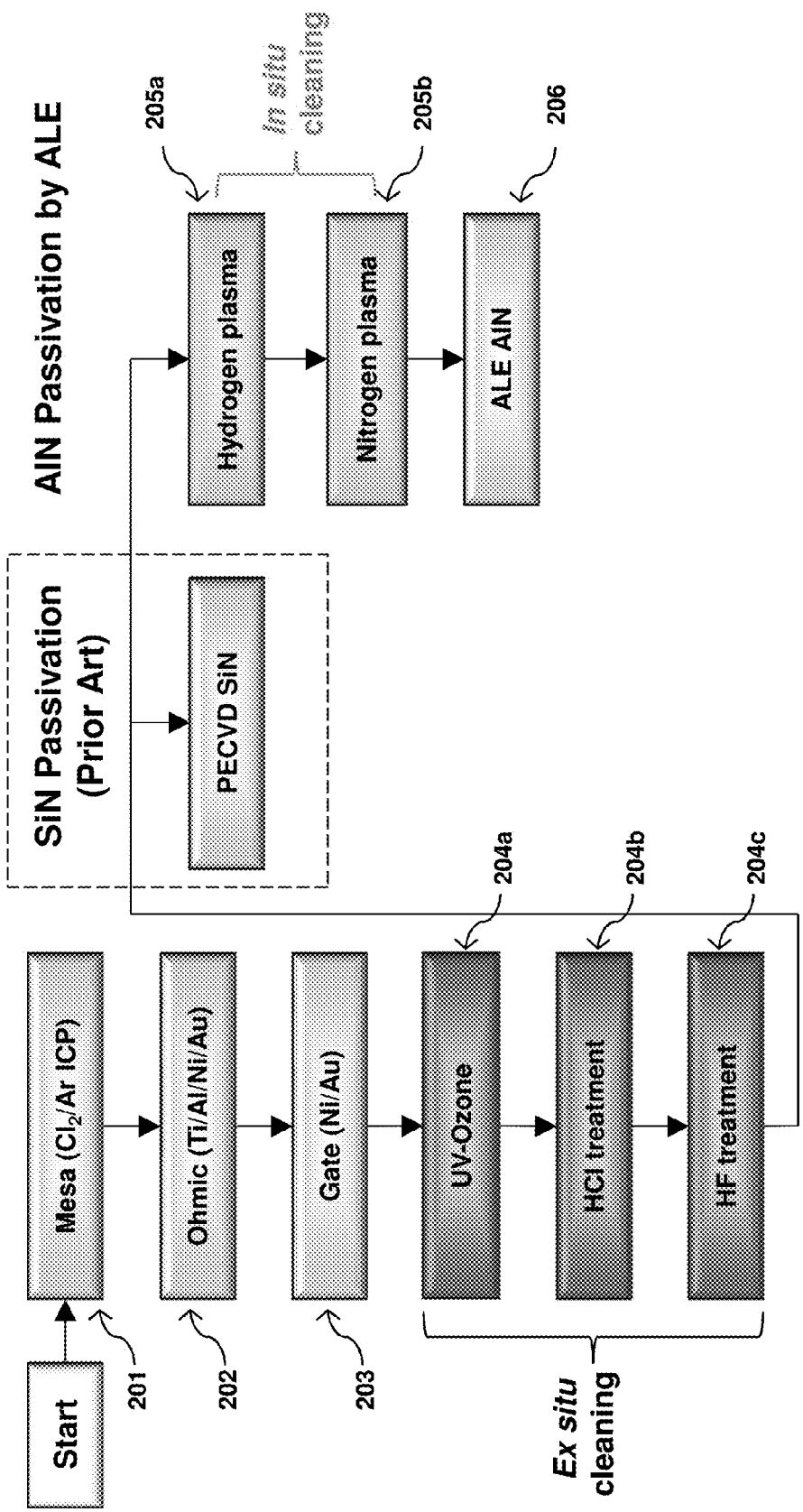
FIG. 2 provides a flow chart outlining exemplary process steps in a method for fabricating a III-nitride passivation layer on an AlGaN/GaN HEMT device using ALE in accordance with the present invention.

FIG. 2 is a flow diagram illustrating exemplary process steps in a method for formation of a passivated AlGaN/AlN HEMT having a III-nitride passivation layer grown after gate formation in accordance with the present invention.

As described in more detail below, in accordance with the present invention, the passivation layer is formed on an upper surface of the AlGaN barrier layer by atomic layer epitaxy (ALE). Growth of the passivation layer by ALE uses ultrahigh purity (UHP) gasses and a wide range of growth temperatures (300 to 850° C.), and allows for precise control of layer thicknesses via self-limiting growth conditions. In many embodiments, the passivation layer is in the form of an AlN layer grown by ALE at a temperature of about 550° C. after formation of the gate. Use of such relatively low temperatures permits growth of the AlN passivation layer after formation of a thermally sensitive gate such as a Schottky metal gate on the AlGaN surface and enables the growth of a conformal passivation layer over the entire device. However, as noted above, the passivation layer can be grown by ALE either before or after the formation of the gate metal electrode at temperatures between 300° C. and 850° C., depending on the passivation material and the gate metal used.

Fabrication of the channel/buffer layers and barrier layers in the HEMT can be accomplished using any suitable process steps, and is not deemed to be part of the present invention. For example, the channel/buffer and barrier layers can be formed by growing an AlN, AlGaN, or GaN channel/buffer on a sapphire, SiC, Si, GaN, or AlN substrate in such a manner that the Ga-polar (0001) face is the dominant face for growth of III-nitride material on the surface thereof, and then growing, by MOCVD or MBE, an AlGaN epitaxial barrier layer on the Ga-polar (0001) face of the channel/buffer layer.

Once the channel/buffer layer and barrier layers have been formed, mesa isolation trenches are formed in the barrier layer to define an area on the surface of the barrier layer on which the source, drain, and gate elements making up the HEMT are to be formed, with the mesa isolation trenches being formed, e.g., by $Cl_2$/Ar ICP etching as in step 201 of the flow diagram shown in FIG. 2. In the next step (step 202), ohmic contacts for the source and drain are formed on the surface of the AlGaN barrier layer, where the ohmic contacts can be formed from any suitable metal, but typically are formed from one or more of titanium (Ti), aluminum (Al), nickel (Ni), and gold (Au).

Following the formation of the ohmic contacts, in step 203, the gate metal electrode is deposited on the AlGaN surface, where the gate metal is often a Schottky gate metal (e.g., Ni/Au), with the metal being in direct contact with semiconductor.

Following formation of the source, drain, and gate(s) on the HEMT, the device is then subjected to an ex situ cleaning in order to prepare the barrier layer surface for growth of the passivation layer thereon. In a first cleaning step 204a, the sample is subjected to UV-ozone cleaning to remove contaminants from the surface of the AlGaN barrier layer. The UV-ozone forms an oxide layer on the cleaned surface of the AlGaN barrier layer, and in steps 204b and 204c, this oxide layer along with additional surface contaminants are removed by subjecting the AlGaN surface to an HCl treatment followed by an HF treatment. It should be noted that although these cleaning steps may be preferred for cleaning of an AlGaN barrier layer, other cleaning steps and cleaning compositions may be used, both for AlGaN and for other barrier layer materials.

Once the structure is cleaned, the passivation layer can be grown thereon. As described above, the passivation layer in accordance with the present invention is a III-nitride passivation layer grown by ALE at temperatures of about 300° C. to about 850° C., with the passivation layer being in many cases an AlN layer grown after the formation of the gate metal electrode at a temperature of about 550° C.

Thus, in accordance with the present invention, following the ex situ cleaning steps described above, the cleaned structure is placed in an ALE chamber for growth of a III-nitride passivation layer thereon. Use of ALE to form the passivation layer also permits the HEMT to be cleaned in situ the ALE chamber. Thus, in steps 205a and 205b in accordance with the present invention, the structure is subjected to in situ hydrogen plasma (step 205a) and nitrogen plasma (step 205b) cleaning, which further reduces the presence of surface contaminants on the device. Finally, in step 206, a III-nitride passivation layer having a thickness of about 0.5 nm to about 300 nm is grown on the cleaned surface by ALE, using ALE deposition techniques and optimized recipes known to those skilled in the art, at a temperature of about 300° C. to about 850° C., with the growth temperature being about 550° C. in the case where the passivation layer is AlN grown after formation of the gate.

As noted above, in other embodiments, the III-nitride passivation layer can be grown by ALE, typically at temperatures between about 300° C. and about 850° C., before formation of the source, gate, and drain electrodes, where the ex situ cleaning steps 204a/b/c, the in situ cleaning steps 205a/b, and the ALE growth step 206 are be performed before steps 202 and 203; in some such embodiments, contact windows exposing the AlGaN surface for the source, gate, and drain are etched in the passivation layer, e.g., by a $Cl_2$ plasma or in heated AZ400K developer, while in other such embodiments, contact windows are etched only for the source and drain, leaving the passivation layer intact under the gate to serve as a gate dielectric.

In other embodiments, the III-nitride passivation layer can be grown by ALE at temperatures between about 300° C. and about 850° C. after fabrication of the source and drain but before the gate, i.e., where step 203 is performed after the ALN growth step 206, and in some such cases, the passivation layer is etched to expose the AlGaN surface while in others it is left intact to serve as a gate dielectric.

In still other embodiments, the III-nitride passivation layer is grown by ALE after formation of the source, gate, and drain so as to form a conformal coating over all surfaces of the device that can provide a hermetic seal protecting the device from harsh environmental conditions. Growth can be at any appropriate temperature between about 300° C. and about 850° C. depending on the passivation material and the gate metal used.

FIGS. 3A and 3B are block diagrams illustrating exemplary embodiments of a HEMT device which includes a III-nitride passivation layer formed by ALE in accordance with the present invention.

As shown in FIGS. 3A and 3B, an exemplary passivated HEMT device in accordance with the present invention can include a channel/buffer layer such as GaN layer 301, a barrier layer such as AlGaN layer 302 disposed on the channel/buffer layer, a source 303, gate 304, and drain 305 formed on the barrier layer, and a passivation layer such as AlN passivation layer 306 disposed on AlGaN barrier layer 302. As illustrated in FIGS. 3A and 3B, the presence of the passivation layer between the gate and the drain prevents the depletion of the two-dimensional electron gas (2DEG) in the GaN channel/buffer layer, allowing the current to flow freely through the device, thereby improving its performance.

In some embodiments, such as the embodiment illustrated in FIG. 3A, passivation layer 306 is formed before formation of the gate, with the passivation layer being grown on the AlGaN layer and a contact window for the gate electrode being etched in the passivation layer.

In other embodiments, the passivation layer is grown after gate formation, which, as noted above, is possible using the method of the present invention because the passivation layer is grown by means of ALE at temperatures low enough, e.g., around 500° C., so as not to damage the metal gate electrode. Growing the passivation layer after formation of the gate electrode also eliminates the need for etching the passivation layer under the gate, which can damage the 2DEG.

In some such embodiments, such as the embodiment illustrated in FIG. 3B, passivation layer 306 is grown conformally over all structures in the device, including the AlGaN layer, the source, the gate, and the drain to form a hermetically sealed device impervious to gas and liquid, providing environmental protection to the device. In addition, growing the passivation layer conformally over the device can affect the amount of strain that the passivation layer transfers to the AlGaN/GaN heterojunction, potentially increasing the 2DEG sheet carrier density.

EXAMPLE

We have experimentally fabricated an AlGaN/GaN HEMT with 4 nm thick AlN passivation capping layers formed by ALE at temperatures up to 500° C. These layers were implemented and qualified against standard plasma-enhanced chemical vapor deposition (PECVD) $SiN_x$ passivation. These passivation schemes were implemented on separate pieces of the same AlGaN/GaN-on-Si HEMT wafer, after gate metal deposition, and were characterized using DC and pulsed I-V measurements.

Preparation of the surface for ALE growth consisted of ex situ UV-Ozone treatment for carbon contamination removal, followed by HCl and HF treatments and low damage in situ nitrogen and hydrogen plasma pretreatments for removal of native surface oxides. The AlN layers were grown on prepared AlGaN surfaces by ALE, using pulses of high purity trimethylaluminum (99.999%) and ultra-high purity nitrogen plasma over a range of temperatures between 300 and 500° C. with a fixed pulse sequence.

The AlN capping layer grown at 500° C. was shown to improve performance by providing the lowest sheet resistance ($R_{sh}$), off-state leakage, and sub-threshold slope, with no degradation in the Schottky gate. Pulsed I-V off-state stress was applied at a gate quiescent point ($V_{G,Q}$) of −4 V and drain quiescent biases ($V_{D,Q}$) up to 50 V (pulse width of 200 ns and pulse separation of 1 ms), while the device is pulsed to obtain the on-state transfer characteristics.

The Table below shows the DC parameters for an unpassivated device, a device having conventional PECVD $SiN_x$ passivation in accordance with the prior art, a device having conventional ALD-grown AlN passivation grown at 300° C., and a device having an AlN passivation layer grown by ALE at 500° C. in accordance with the present invention.

| Passivation | $N_s$ (cm$^{-2}$) | Hall Mobility (cm$^2$/(V·s)) | $R_{sh}$ (Ω/□) | $V_T$ (V) | SS (mV/dec) |
|---|---|---|---|---|---|
| Unpassivated | 7.12 × 10$^{12}$ | 1703 | 523 | — | — |
| PECVD SiN (100 nm) | 8.60 × 10$^{12}$ | 1567 | 463 | −3.51 | 116 |
| ALD AlN at 300° C. (4 nm) | 8.30 × 10$^{12}$ | 1790 | 418 | −3.12 | 115 |
| ALE AlN at 500° C. (4 nm) | 8.55 × 10$^{12}$ | 1765 | 414 | −3.25 | 76 |

As can be seen from the Table, the presence of a thin AlN passivation layer improves the DC performance of a HEMT device over that of both the unpassivated device and a device having a conventional $SiN_x$ passivation layer in accordance with the prior art. For example, an unpassivated device has a 2DEG carrier density $N_s$ of 7.12×10$^{12}$, a Hall mobility of 1703 cm$^2$/(V·s), a sheet resistance of 523 (Ω/□). Although a SiN-passivated device exhibits improved an improved 2DEG sheet carrier density $N_s$ of 8.60×10$^{12}$ and an improved sheet resistance (R_sh) of 463 (Ω/□), its Hall mobility is significantly decreased as compared to that of the unpassivated device. In contrast, an AlN-passivated device exhibits substantially improved [N_s], Hall mobility, sheet resistance, threshold voltage (V_T) and subthreshold swing (SS) over the SiN-passivated reference. Although this is true for AlN passivation layers grown by means of 300° C. ALD and as well as by for AlN passivation layers grown by means of 500° C. ALE, as discussed below, the performance of the device having an AlN passivation layer grown by ALE at 500° C. is not only notably better than the performance of the SiN-passivated device but is better than the performance of the device having an AlN passivation layer grown by ALD at 300° C.

For example, as can be seen from the Table, the ALE AlN-passivated device exhibits a notable decrease in sub-threshold swing as compared to both the SiN- and the ALD AlN-passivated devices due to a reduction in interference traps, with an SS value of 76 as compared to 116 and 115 for the $SiN_x$ and ALD AlN-passivated devices, respectively.

The plots in FIGS. 4-6 discussed below further demonstrate the improvement in performance of an ALE AlN-passivated device in accordance with the present invention over the SiN- and ALD AlN-passivated devices in accordance with the prior art. Although in some respects, an ALD AlN-passivated device performs as well as an ALE AlN-passivated one, one skilled in the art will readily recognize that the overall performance of a device passivated with an ALE AlN layer is superior to that of either a SiN-passivated one or one passivated with a layer of ALD FIGS. 4A and 4B are plots showing the $I_G$-$V_G$ and $I_D$-$V_G$ curves at 0.1 V $V_{DS}$ for HEMTs having $SiN_x$ passivation in accordance with the prior art, AlN passivation formed by ALD growth of thin AlN layers at 300° C. in accordance with the prior art, and ALE growth of thin AlN layers at 500° C. in accordance with the present invention.

Figure 4A:
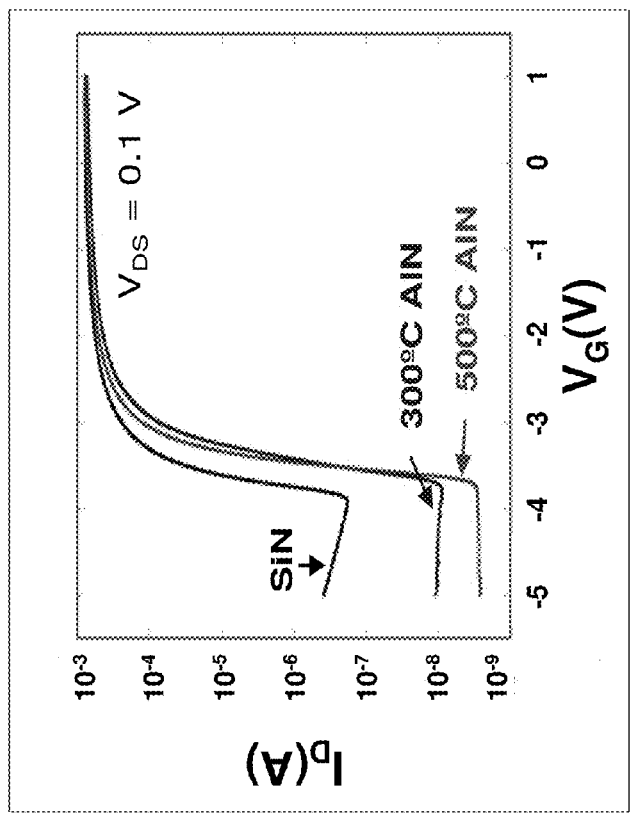
FIGS. 4A and 4B are plots showing the DC $I_G$-$V_G$ (FIG. 4A) and $I_D$-$V_G$ (FIG. 4B) curves of AlGaN/GaN HEMTs having a SiN$_x$ passivation layer in accordance with the prior art and an AlN passivation layer formed by ALE in accordance with the present invention.

As can be seen from the plots in FIG. 4A, though the gate current $I_G$ is lower for the AlN-passivated devices at all gate voltages $V_G$, showing that both AlN-passivated devices exhibit less current leakage than does the SiN-passivated one, with the device having an AlN passivation layer formed by 500° C. ALE having even less current leakage (a lower IG) than does the device having a passivation layer formed by 300° C. ALD.

Figure 4B:
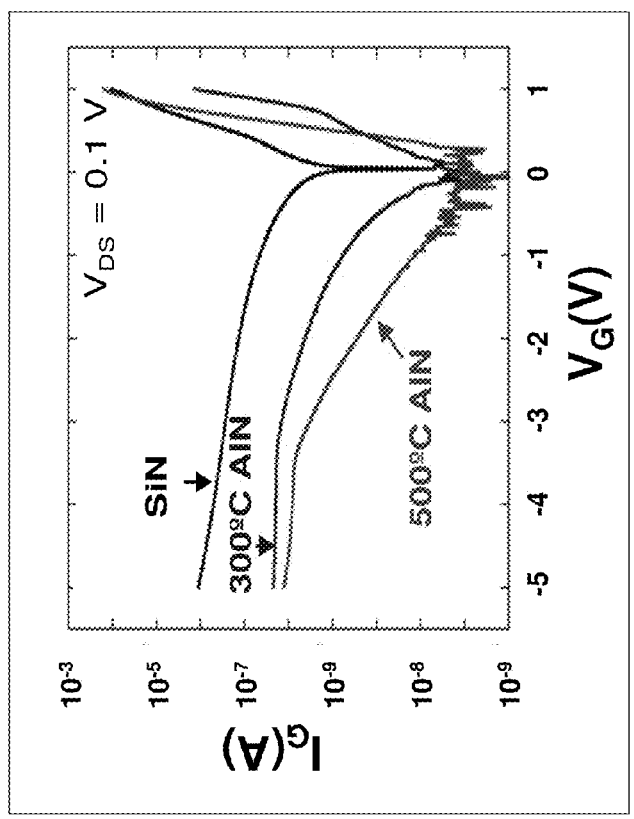

In addition, as can be seen from the plots in FIG. 4B, although the OFF-state drain current ($I_D$) is greatly reduced in both AlN-passivated devices as compared to the SiN passivated one, the device having an AlN passivation layer formed by 500° C. ALE performs better than the device having 300° C. ALD-formed AlN passivation. Also, one skilled in the art reading the plots in FIG. 4B will readily appreciate that the ON/OFF current ratio and subthreshold swing (SS) are also greatly improved in the ALE AlN-passivated device, with both the ON/OFF current ratio and the subthreshold swing being lower than in the other devices.

Figure 5:
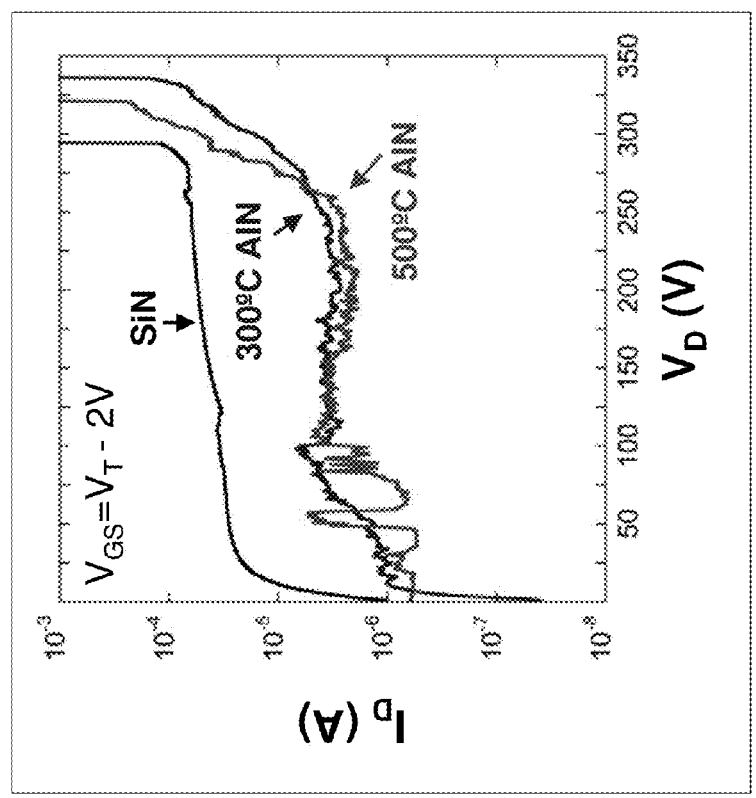
FIG. 5 is a plot showing non-recoverable off-state breakdown during drain voltage sweep at a rate of 2 V/sec for AlGaN/GaN HEMTs having a conventional SiN$_x$ passivation layer and having an AlN passivation layer formed by ALE in accordance with the present invention.

As can be seen from the plots in FIG. 5, the OFF-state leakage current $I_D$ for AlN-passivated devices is reduced by an order of magnitude compared to SiN-passivated HEMTs, with both ALD and ALE AlN-passivated devices exhibiting ID of just over $10^{-6}$ Amps as compared to over $10^{-5}$ Amps for the SiN-passivated device. As also can be seen from the plots in FIG. 5, the AlN-passivated devices show better OFF-state breakdown voltage than is exhibited by the SiN-passivated device.

Figure 6:
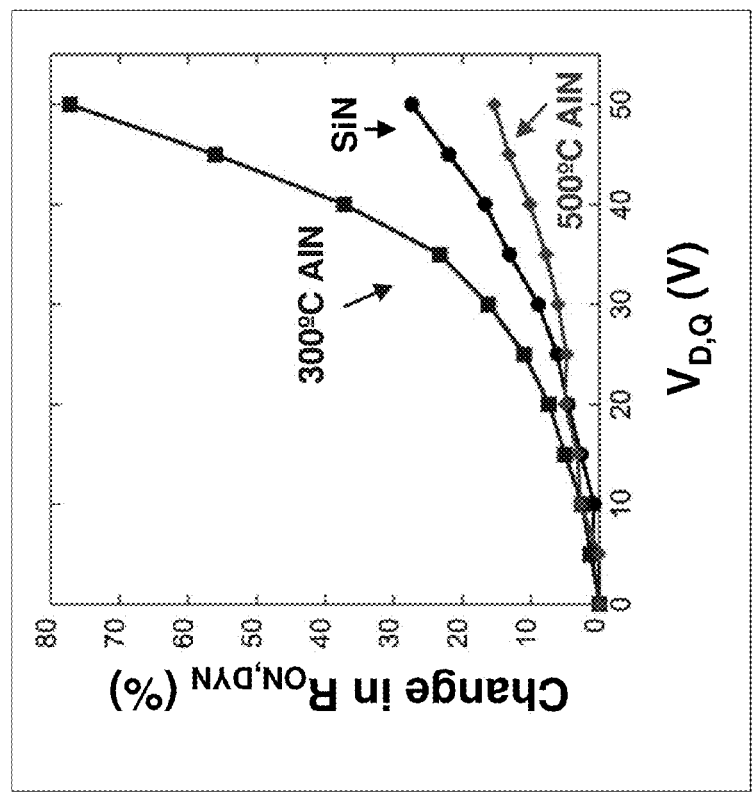
FIG. 6 is a plot showing the change in dynamic $R_{ON}$ for various quiescent point drain voltage stress for AlGaN/GaN HEMTs having a conventional SiN$_x$ passivation layer and having an AlN passivation layer formed by ALE in accordance with the present invention.

FIG. 6 shows plots depicting the change in dynamic ON-resistance ($R_{ON,DYN}$) for HEMT device having $SiN_x$ passivation, AlN passivation formed by ALD growth of AlN at 300° C., and AlN passivation formed by ALE at 500° C. in accordance with the present invention. The plots in FIG. 6 thus show that an ALE AlN passivation layer grown at 500° C. reduces degradation of $R_{ON,DYN}$ during pulsed I-V off-state stress compared to conventional $SiN_x$ passivation by approximately 50% and by significantly more compared to ALD AlN passivation.

Thus, the plots in FIGS. 4A-4B, 5, and 6 show that the AlN passivated HEMTs formed by ALE in accordance with the method of the present invention exhibit lower off-state leakage current and higher breakdown voltage than do either conventional PECVD $SiN_x$ passivation layers or AlN films grown by ALD in accordance with the prior art. In addition, by using relatively low (around 500° C.) growth temperatures, the III-nitride passivation films can be grown after formation of the gate electrodes in the HEMT without damaging the Schottky metal, enabling the growth of a conformal passivation layer over the entire device that can form a hermetic seal protecting the device from harsh environmental conditions.

Alternatives:

The present invention can be implemented in many ways, including using one or more of the alternatives described below.

In some embodiments, the III-nitride passivation layer can form a hermetic seal impervious to liquid and gas around the device to provide environmental protection.

In some embodiments, a semi-resistive layer can be formed between gate and drain to form a graded electric field for high breakdown voltage.

In some embodiments, the III-nitride passivation layer can be deposited directly on a III-nitride device layer.

In some embodiments, the III-nitride passivation layer can be deposited before or after formation of the Ohmic layers on the device.

In some embodiments, a GaN cap layer can be formed on the surface of the III-nitride passivation layer to provide oxidation resistance and improved passivation. In some embodiments, the GaN is doped, while in other embodiments, the GaN cap is undoped.

In some embodiments, a silicon nitride layer can be formed on the surface of the III-nitride passivation layer to provide oxidation resistance and improved passivation.

In some embodiments, the III-nitride passivation layer can be crystalline, highly oriented, or single-crystal. More generally, the III-nitride passivation layer can be polycrystalline or amorphous.

In some embodiments, the III-nitride passivation layer can have an XRD rocking curve value less than 1000 arc second.

In some embodiments, the III-nitride passivation layer can be non-relaxed III-nitride material not lattice-matched to the barrier layer, such as AlN passivation on an AlGaN barrier.

In some embodiments, the III-nitride passivation layer can be a relaxed III-nitride material that is lattice-matched to the barrier layer, such as InAlGaN passivation on AlGaN barrier.

In some embodiments, there is a thin dielectric layer such as silicon nitride beneath III-nitride passivation layer.

In some embodiments, there is a dielectric spacer on transistor gate sidewall.

In some embodiments, the transistor gate is a T-gate.

In some embodiments, the transistor has a gate insulation layer such as Al2O3, HfO2, crystalline AlN, non-crystalline AlN, or other dielectric material known to those skilled in the art beneath the gate.

In some embodiments, the III-nitride passivation layer is deposited so that it forms a conformal coating material layer on the exposed surfaces of the transistor gate, material, ohmic contacts, III-nitride barrier material, isolation material between device, and other transistor exposed surfaces.

In some embodiments, the gate insulator is etched to epitaxial III-nitride material surface such that the etch of the gate insulator material is self-aligned to gate edge and the ALE III-nitride passivation layer is conformally grown on the exposed surface of the transistor.

In some embodiments, the native oxide on the surface of the III-nitride material is removed prior to deposition or growth of the III-nitride passivation layer.

In some embodiments, the gate material is selected from the group including but not limited to nickel, nickel with gold above nickel, platinum, refractory metal, metal nitrides, titanium nitride, molybdenum nitride, zirconium nitride, copper, and the like.

In some embodiments, the III-nitride passivation layer induces a strain entirely under the gate for short gate width in the direction from source to drain, or can induce a strain partially under the gate for longer gate width in the direction from source to drain, where in some embodiments, that is induced is be a tensile strain.

In some embodiments, the III-nitride reduces the inverse piezoelectric effect.

In some embodiments, the III-nitride passivation layer is a hermetic layer.

In some embodiments, the III-nitride passivation layer has a high-temperature grown III-nitride passivation layer over the exposed transistor surface over the transistor region but has a low-temperature ALD/ALE deposited material on an exposed region outside of the device region after an optional bonding wire or tape attachment to coat the bond wire or tape attachment with a hermetic coating.

In some embodiments, an additional dielectric layer(s) or polymer layer is deposited above the III-nitride passivation layer.

In some embodiments, a diamond layer is deposited on the III-nitride passivation layer to provide enhanced thermal conductivity and enhanced break down voltage.

In some embodiments, a crystalline III-Nitride passivation layer is grown after the gate formation.

In some embodiments, the III-nitride passivation layer is from the group of compound semiconductors having two or more of nitrogen gallium, indium, or aluminum.

In some embodiments, a sequentially stacked material layer can be deposited on surface of ALE AlN.

In some embodiments, the III-nitride passivation layer is deposited after wire bond or tape connection.

In some embodiments, the III-nitride passivation layer can be used with transistors that use gate recess structure, regrown contact structure, or gate replaced process.

In some embodiments, the III-Nitride passivation layer or all of the III-nitride passivation layers is an insulating layer while in other embodiments, one or more of the III-nitride passivation layers is non-insulating.

Thus, the present invention provides many embodiments, aspects, and features for a III-nitride passivation layer formed on an AlGaN/GaN HEMT and methods for forming the same. It should be readily appreciated that modifications of these embodiments, aspects, and features may be made by persons skilled in the art. The present application contemplates any and all modifications within the spirit and scope of the underlying invention described and claimed herein, and all such embodiments are within the scope and spirit of the present disclosure.

What is claimed is:

1. A method for forming a passivated AlGaN/GaN HEMT, comprising:
    forming a GaN buffer/channel layer on a substrate;
    forming an AlGaN barrier layer on the GaN buffer/channel layer to form an AlGaN/GaN structure;
    etching mesa isolation trenches in the AlGaN barrier layer to define an area on an upper surface of the barrier layer on which a source, a drain, and a gate element of a HEMT are to be formed;
    subjecting the AlGaN/GaN structure to an ex situ cleaning to prepare the AlGaN/GaN structure for growth of a III-nitride passivation layer thereon;
    placing the cleaned AlGaN/GaN structure into an atomic layer epitaxy (ALE) reaction chamber and subjecting the AlGaN/GaN structure to an in situ cleaning to further prepare the AlGaN/GaN structure for growth of the III-nitride passivation layer thereon;
    growing the III-nitride passivation layer on an upper surface of the AlGaN barrier layer by ALE at a temperature of about 300° C. to about 850° C. to form a passivated AlGaN/GaN structure;
    etching the III-nitride passivation layer to expose portions of the AlGaN surface for deposition of materials for source, a gate, and a drain electrodes; and
    forming the source, gate, and drain electrodes on the portions of the AlGaN surface defined by the etched passivation layer.

2. The method according to claim 1, wherein the III-nitride passivation layer is grown to a thickness of about 0.5 nm to about 300 nm.

3. The method according to claim 1, wherein the III-nitride passivation material is AlN.

4. The method according to claim 1, wherein the III-nitride passivation layer is etched in a $Cl_2$ plasma.

5. The method according to claim 1, wherein the III-nitride passivation layer is etched in a heated AZ400K developer.

6. The method according to claim 1, wherein the gate metal is a Ni/Au Schottky metal.

7. The method according to claim 1, wherein the gate metal is deposited by electron beam evaporation.

8. The method according to claim 1, wherein the gate metal is patterned by liftoff.

9. The method according to claim 1, further comprising depositing a layer of dielectric material on the AlGaN/GaN HEMT before growth of the III-nitride passivation layer thereon.

10. The method according to claim 9, wherein the III-nitride passivation layer comprises a relaxed III-nitride material.

11. The method according to claim 9, wherein the III-nitride passivation layer comprises a non-relaxed III-nitride material.

12. A method for forming a passivated AlGaN/GaN HEMT, comprising:
    forming a GaN buffer/channel layer on a substrate;
    forming an AlGaN barrier layer on the GaN buffer/channel layer to form an AlGaN/GaN structure;
    etching mesa isolation trenches in the AlGaN barrier layer to define an area on an upper surface of the barrier layer on which a source, a drain, and a gate element of a HEMT are to be formed;
    forming the source and drain elements on the surface of the AlGaN barrier layer;
    subjecting the AlGaN/GaN structure to an ex situ cleaning to prepare the AlGaN/GaN structure for growth of a III-nitride passivation layer thereon;
    placing the cleaned AlGaN/GaN structure into an atomic layer epitaxy (ALE) reaction chamber and subjecting the AlGaN/GaN structure to an in situ cleaning to further prepare the AlGaN/GaN structure for growth of the III-nitride passivation layer thereon;
    growing the III-nitride passivation layer on an upper surface of the AlGaN barrier layer by ALE at a temperature of about 300° C. to about 850° C. to form a passivated AlGaN/GaN structure;
    etching the III-nitride passivation layer to expose a portions of the AlGaN surface for deposition of a gate electrode thereon; and
    forming gate electrode on the portions of the AlGaN surface defined by the etched passivation layer.

13. The method according to claim 12, wherein the III-nitride passivation layer comprises a relaxed III-nitride material.

14. The method according to claim 12, wherein the III-nitride passivation layer comprises a non-relaxed III-nitride material.

15. The method according to claim 12, wherein the III-nitride passivation material is AlN.

16. The method according to claim 12, wherein the III-nitride passivation layer is grown to a thickness of about 0.5 nm to about 300 nm.

17. The method according to claim 12, further comprising depositing a layer of dielectric material on the AlGaN/GaN HEMT before growth of the III-nitride passivation layer thereon.

* * * * *